United States Patent
De Poortere

(10) Patent No.: US 6,956,430 B2
(45) Date of Patent: Oct. 18, 2005

(54) DISTORTION DETECTOR

(75) Inventor: Gerrit Frederik Magdalena De Poortere, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 19 days.

(21) Appl. No.: 10/480,418

(22) PCT Filed: Jun. 20, 2002

(86) PCT No.: PCT/IB02/02510

§ 371 (c)(1),
(2), (4) Date: Dec. 11, 2003

(87) PCT Pub. No.: WO03/001221

PCT Pub. Date: Jan. 3, 2003

(65) Prior Publication Data

US 2004/0160278 A1 Aug. 19, 2004

(30) Foreign Application Priority Data

Jun. 25, 2001 (EP) .................... 01202434

(51) Int. Cl.$^7$ .............................................. H03F 1/26
(52) U.S. Cl. ........................................ 330/2; 330/149
(58) Field of Search .................... 330/2, 149; 381/94.1, 381/94.8, 104, 120, 121

(56) References Cited

U.S. PATENT DOCUMENTS

| | | | | |
|---|---|---|---|---|
| 5,453,716 A | * | 9/1995 | Person et al. ................... | 330/2 |
| 5,668,499 A | * | 9/1997 | Albert et al. ................ | 330/118 |
| 5,973,555 A | * | 10/1999 | Kokubo et al. ................ | 330/2 |
| 6,175,270 B1 | * | 1/2001 | Vannucci ....................... | 330/2 |

* cited by examiner

Primary Examiner—Steven J. Mottola
(74) Attorney, Agent, or Firm—Edward W. Goodman

(57) ABSTRACT

A distortion detector comprises a clip detector to generate a distortion pulse, processing means to calculate the duty cycle of the distortion pulse and comparator means for supplying a control signal when the calculated duty cycle exceeds a certain threshold value. This control signal can be used, for example, the reduce the volume of audio reproduction.

5 Claims, 1 Drawing Sheet

DISTORTION DETECTOR

Figure 1:
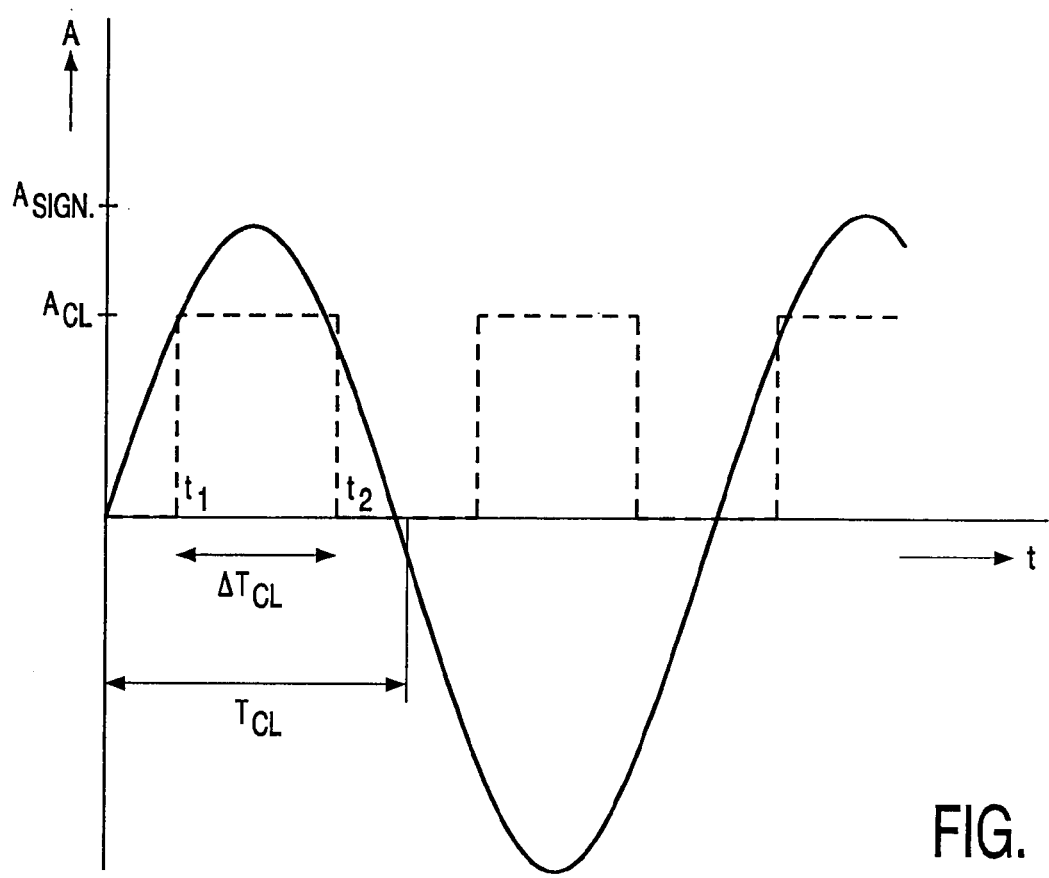

The present invention relates to a distortion detector.

Distortion detectors are well known. Very often, a simple analogue signal clip detector in the form of a single transistor is used when distortion occurs at the output of the power amplifier of an audio set. The distortion information can then be used, for example, to reduce automatically the volume of the audio reproduction. The distortion information, however, can also be used to control other distortion sensitive parameters, such as the bassboost. The main problem with such distortion detectors is that they detect distortion by detection of the point at which signal clipping occurs. As a consequence, it may happen that even a very small distortion triggers the detector, while in practice a higher amount of distortion is acceptable.

In the known distortion detectors a clipping signal in the form of a distortion pulse is generated; the clipping signal is active from the point at which clipping occurs to the point where the clipping ends. The time during which the clipping signal is active is called the clipping time $\Delta T_{cl}$. The higher the amount of distortion, the longer is the clipping time and thus the length of the distortion pulse. However, the distortion pulse behavior is dependent on the frequency of the distorted signal: a sine wave at lower frequency and with lower distortion may have the same distortion pulse length as a somewhat higher frequency with a higher distortion. Therefore, the clipping time is not ambiguously a measure for the amount of distortion.

The purpose of the invention is to overcome the above problems and to provide for a distortion detector by means of which a signal, independent of the frequency of the clipped signal, can be obtained that can reliably be used, for example, to reduce automatically the volume of audio reproduction, taking into account an acceptable and adjustable amount of distortion.

According to the invention the distortion detector comprises a clip detector to generate a distortion pulse, processing means to calculate the duty cycle of the distortion pulse and comparator means for supplying a control signal when the calculated duty cycle exceeds a certain threshold value. This control signal can for example be used to reduce automatically the volume of audio reproduction. The invention is based on the insight that the so-called THD (total harmonic distortion) is a function of the duty cycle of the distortion pulse. The information about the THD is not derived from the level of the clipped signal as for example in U.S. Pat. No. 5,430,409, but from the duty cycle thereof.

Figure 2:
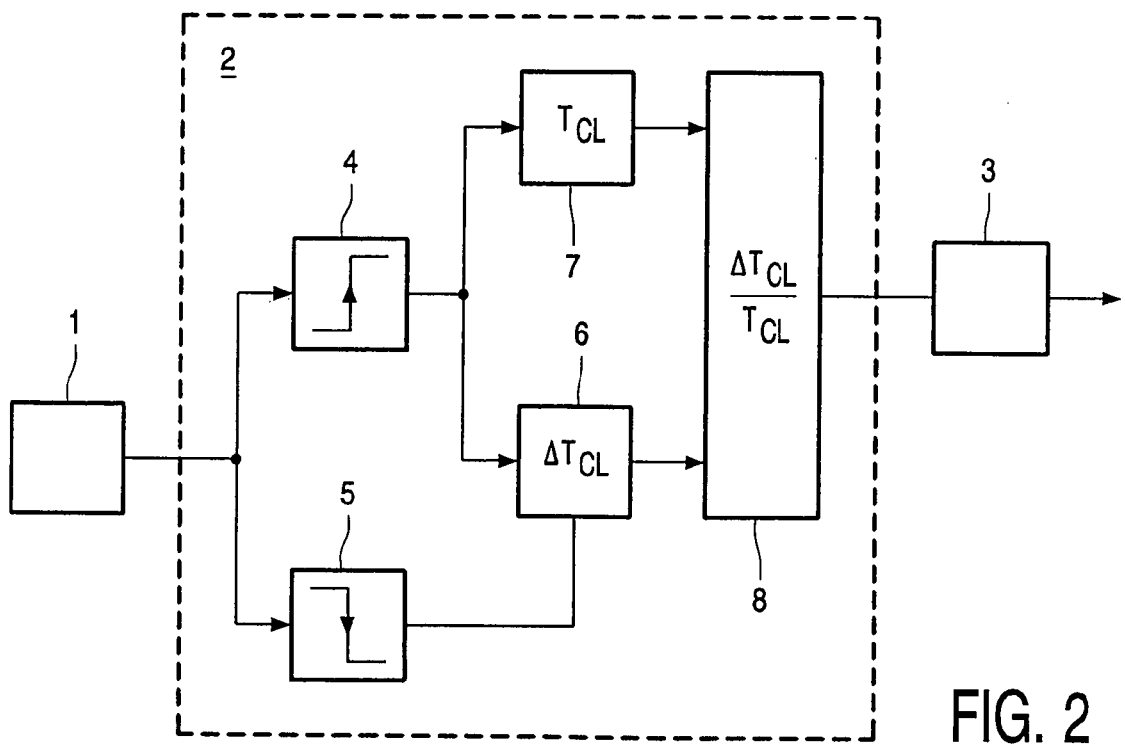

In the following with reference to the drawing an embodiment of the invention will be described in more detail. In the drawing:

FIG. 1 shows a sinusoidal input signal with no clipping and a clipping pulse if said input signal would be clipped at a certain level; and FIG. 2 a schematic diagram of the distortion detector according to the invention.

FIG. 1 shows a sinusoidal input signal $A_{sign}.\sin \omega t$, with $A_{sign}$ the level of the non-clipped signal. If this signal is clipped at level $A_{cl}$ a distortion pulse, indicated by the dotted line, is obtained. The length of this distortion pulse is $\Delta T_{cl} = T_{cl} - 2t_l$ with $T_{cl}$ the period of the distortion signal.

The duty cycle of the distortion pulse is $\Delta T_{cl}/T_{cl} = 1 - 2/\pi . \arcsin[A_{cl}/A_{sign}]$. As it is already known that the THD is a function of the ratio $[A_{cl}/A_{sign}]$, the THD is also a function of the duty cycle $\Delta T_{cl}/T_{cl}$.

FIG. 2 shows a clip detector 1 to supply a distortion pulse, means 2 to calculate the duty cycle $\Delta T_{cl}/T_{cl}$ thereof and comparator means 3 for supplying a control signal when the calculated duty cycle exceeds a certain threshold value. The control signal is used to control the volume of audio reproduction. The calculating means comprise a unit 4 to detect the time at which the leading edge of a distortion appears and a unit 5 to detect the time at which the trailing edge of a distortion signal appears. At the leading edge of a distortion pulse a $\Delta T_{cl}$-counter 6 and a $T_{cl}$-counter 7 are started. At the trailing edge of the distortion pulse the $\Delta T_{cl}$-counter 6 is stopped and read out. As soon as the leading edge of the next distortion pulse is detected, the $T_{cl}$-counter 7 is read out, while both counters are reset and a next cycle will be started. The position of the counters 6 and 7 is registered in divider unit 8, while therein the duty cycle $\Delta T_{cl}/T_{cl}$ is calculated. The calculated duty cycle is supplied to the comparator means 3. The comparator means 3 may comprise a table of the percentage THD against the duty cycle of the distortion pulse; this table can be determined via numerical FFT analysis. A specific percentage of distortion to be acceptable can than be adjusted. When a calculated duty cycle exceeds an adjusted threshold value of when the percentage of distortion corresponding with a calculated duty cycle exceeds an adjusted percentage, a control signal is supplied to reduce the volume of audio reproduction.

Although the calculations in the distortion detector can be done in hardware, it is convenient to perform the functions of the calculating and comparator means in software, as mostly a microprocessor will already be present in the device in which the distortion detector is applied, for example an audio device.

The invention is not limited by the embodiment described with reference to the accompanying drawing, but comprises all modifications which fall within the scope of the following claims.

What is claimed is:

1. A distortion detector comprising;
   a clip detector for generating a distortion pulse;
   processing means for calculating a duty cycle of the distortion pulse; and
   comparator means for supplying a control signal when the calculated duty cycle exceeds a certain threshold value.

2. The distortion detector as claimed in claim 1, characterized in that the calculating means comprises;
   detection units for detecting the occurrence of leading and trailing edges of distortions pulse;
   counters controlled by output signals of the detection units for determining a length of the distortion pulse and the period of the distortion pulses; and
   divider means for calculating, from the distortion pulse length and the period of the distortion pulses, the duty cycle of the distortion pulses.

3. The distortion detector as claimed in claim 1, characterized in that the comparator means comprises:
   a memory containing a table of distortion percentages against duty cycle values; and
   means for determining whether the distortion percentage, corresponding with a calculated duty cycle, exceeds an adjusted distortion percentage.

4. The distortion detector as claimed in claim 1, characterized in that the processing means and the comparator means are implemented in a microprocessor.

5. An audio implement, provided with a distortion detector according to claim 1 for reducing the volume of audio reproduction when the calculated duty cycle exceeds a certain threshold value.

* * * * *